United States Patent [19]

Samuels et al.

[11] Patent Number: 5,880,369
[45] Date of Patent: Mar. 9, 1999

[54] MICROMACHINED DEVICE WITH ENHANCED DIMENSIONAL CONTROL

[75] Inventors: Howard R. Samuels, Newton; Jeffrey A. Farash, Holbrook, both of Mass.

[73] Assignee: Analog Devices, Inc., Norwood, Mass.

[21] Appl. No.: 616,713

[22] Filed: Mar. 15, 1996

[51] Int. Cl.[6] .............................................. G01P 15/125
[52] U.S. Cl. .................................. 73/514.32; 73/514.16; 361/280; 361/283.3
[58] Field of Search ........................... 73/514.32, 514.18, 73/514.16, 514.01; 361/280, 283.3

[56] References Cited

U.S. PATENT DOCUMENTS

| | | | |
|---|---|---|---|
| 5,286,944 | 2/1994 | Li ........................................... | 219/69.15 |
| 5,345,824 | 9/1994 | Sherman et al. ...................... | 73/514.32 |
| 5,364,497 | 11/1994 | Chau et al. ............................. | 156/645 |
| 5,447,067 | 9/1995 | Biebl et al. ........................... | 73/514.32 |
| 5,447,068 | 9/1995 | Tang ..................................... | 73/514.32 |
| 5,495,761 | 3/1996 | Diem et al. ........................... | 73/514.32 |
| 5,511,420 | 4/1996 | Zhao et al. ............................. | 73/514.18 |
| 5,542,295 | 8/1996 | Howe et al. ........................... | 73/514.18 |
| 5,563,343 | 10/1996 | Shaw et al. ............................ | 73/514.18 |
| 5,565,625 | 10/1996 | Howe et al. ........................... | 73/514.16 |
| 5,574,222 | 11/1996 | Offenberg ............................... | 73/514.32 |
| 5,618,989 | 4/1997 | Marek ...................................... | 73/1.38 |
| 5,635,638 | 6/1997 | Geen ...................................... | 73/504.04 |
| 5,646,347 | 7/1997 | Weiblen et al. ........................ | 73/514.32 |

FOREIGN PATENT DOCUMENTS 9319343  9/1993  WIPO .

OTHER PUBLICATIONS

Offerens, H. L. et al., "Methods for the Fabrication of Convex Corners in Anisotropic Etching of (100) Silicon in Aqueous KOH," Sensors and Actuators—A Physical, vol. A25, No. 1/03, Oct. 1, 1990.

Ohwada, K. et al., "Groove Depth Uniformization in (110) Si Anisotropic Etching by Ultrasonic Wave and Application to Accelerometer Fabrication," Proceedings of the Workshop on Micro Electrical Mechanical Systems (MEMS), Amsterdam, Jan. 29–Feb. 2, 1995, Institute of Electrical and Electronics Engineers, pp. 100–105.

*Primary Examiner*—Hezron E. Williams
*Assistant Examiner*—Richard A. Moller
*Attorney, Agent, or Firm*—Hale and Dorr LLP

[57] ABSTRACT

A micromachined device is provided that establishes select dimensional relationships between micromachined structures to achieve correlation in dimensional variation among these structures. Such dimensional relationships are achieved through consistent spacing between desired operating structures and by adding new structures (i.e., dimensional control structures) which provide additional consistent spacing at desired locations within the micromachined device.

22 Claims, 4 Drawing Sheets

5,880,369

MICROMACHINED DEVICE WITH ENHANCED DIMENSIONAL CONTROL

BACKGROUND OF THE INVENTION

The present invention relates to the field of micromachined devices and, more particularly, to dimensional control of structures within micromachined devices.

"Micromachined device," as the term is used herein, refers to a device containing a three-dimensional structure manufactured using the same photolithographic techniques and batch processing as for integrated circuits. Micromachined structures are frequently used as sensors or actuators and, in some existing applications, are used to detect and measure acceleration with piezoresistors or capacitors. In the latter case, a differential capacitor is typically used.

A differential-capacitor based acceleration sensor includes three primary micromachined elements; a central member, capacitor plates and support springs. The member, supported by springs, is positioned midway between two plates so that one capacitor is formed by a first plate and the member and a second (and equal) capacitor is formed by a second plate and the member. To maximize the sensor capacitance, the member may contain numerous fingers that are interleaved between fingers from the two plates. Various shapes and arrangements of the capacitor plates may be used. Examples of such devices are provided in commonly-owned U.S. Pat. No. 5,345,824 and U.S. patent application Ser. No. 08/347,795, now U.S. Pat. No. 5,565,625, both of which are hereby expressly incorporated by reference in their entirety for all purposes.

The sensitivity of a micromachined sensor is determined by a variety of factors, including sensor capacitance, spring constant ("k"), mass of certain elements (e.g., central member), polysilicon thickness, parasitic capacitance and variations in crystal orientation in polysilicon. Among these, spring constant and sensor capacitance are the dominant factors. The sensitivity of a micromachined sensor may vary significantly due to manufacturing variations which alter dimensions of micromachined structures within the sensor. Accordingly, some post-manufacturing calibration is typically required. Effective calibration requires an accurate determination of sensitivity, which is largely determined by accurate estimations of spring constant and sensor capacitance values.

Although the springs and capacitors of a micromachined sensor are manufactured using the same processes, variations in these processes do not necessarily affect the different structures disposed within these components the same way (i.e., each structure may vary independently in size). Such disparate dimensional variation between physically and/or functionally different structures makes it difficult to accurately estimate component values and, thereby, predict device performance.

Accordingly, a new micromachined device is required that facilitates correlation of dimensional variation between micromachined structures.

SUMMARY OF THE INVENTION

The present invention is directed to an apparatus that facilitates correlation of dimensional variation between micromachined structures by establishing select dimensional relationships between these structures. In a preferred embodiment, a micromachined device constructed according to the principles of the invention includes a first structure; a second structure disposed proximate to the first structure at a predefined distance; a third structure which is physically different from the first and second structures, and a fourth structure disposed proximate to the third structure at approximately the predefined distance, the fourth structure also being physically different from the first and second structures.

A further understanding of the nature and advantages of the invention may be realized by reference to the remaining portions of the specification and drawings.

DESCRIPTION OF SPECIFIC EMBODIMENTS

Figure 1:
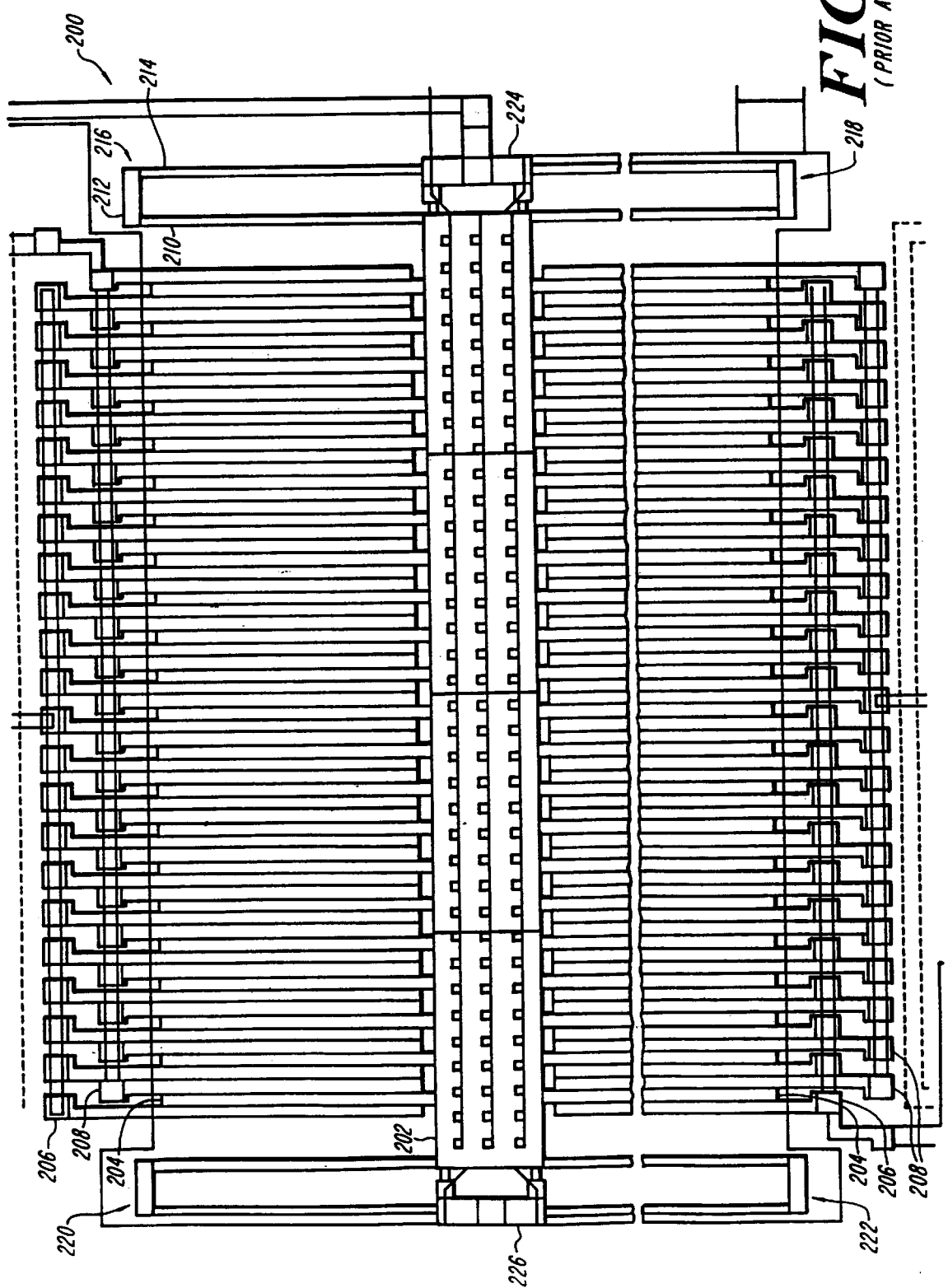
FIG. 1 is a layout diagram of an acceleration sensor used in a commercially-available accelerometer.

FIG. 1 illustrates the layout (drawn to scale), of an exemplary micromachined acceleration sensor 200. This sensor is used in a commercially available accelerometer (i.e., the "ADXL05") manufactured by Analog Devices, Inc., located in Norwood, Massachusetts ("Analog"). The ADXL05 is described in a data sheet published by Analog and entitled ±1 g to ±5 g Single Chip Accelerometer with Signal Conditioning—ADXL05, Rev. 0 (1995), which is hereby incorporated by reference in its entirety for all purposes.

Sensor 200 includes forty-four sense fingers 204, which are coupled to central member 202 and form sensor capacitors with fixed fingers 206 and 208. The distance to ($d_o$) between fingers 204 and 206 (forming a capacitor C1) and fingers 204 and 208 (forming a capacitor C2) determines, to a great extent, sensor capacitance. Sensor 200 also includes springs 216–222, which couple central member 202 to an underlying substrate through anchors 224 and 226. The width (W) of spring legs 210 and 214 determines, to a great extent, the spring constant k of these sensor components.

As noted above, the sensitivity of a micromachined acceleration sensor is determined primarily by its sensor capacitance and spring constant. Although the underlying components of these factors (i.e., springs 216–222 and capacitors formed from fingers 204–208) are manufactured with the same processes, variations in these processes affect the structures within each component differently. This disparate effect is a direct result of the different layout environments associated with each component. Specifically, capacitor fingers 204–208 are closely surrounded by other polysilicon structures while spring legs 210 and 214 are essentially isolated from other structures as well as themselves.

According to the principles of the invention, by laying out the micromachined structures of interest (in this case, for example, fingers 204–208 and legs 210,214) such that any critical dimensions (e.g., the gap between fingers 204–208 which is defined by finger width, and the width of legs 210,214) exist in the same type of surroundings, correlation of the resulting features (e.g., finger and leg width) can be greatly improved. As discussed below, this is achieved by a combination of layout techniques which emphasize consistent spacing between existing, operating structures, and by adding new structures (i.e., "dimensional-control structures") to the layout which provide additional consistent spacing at select locations within a micromachined device.

Figure 2:
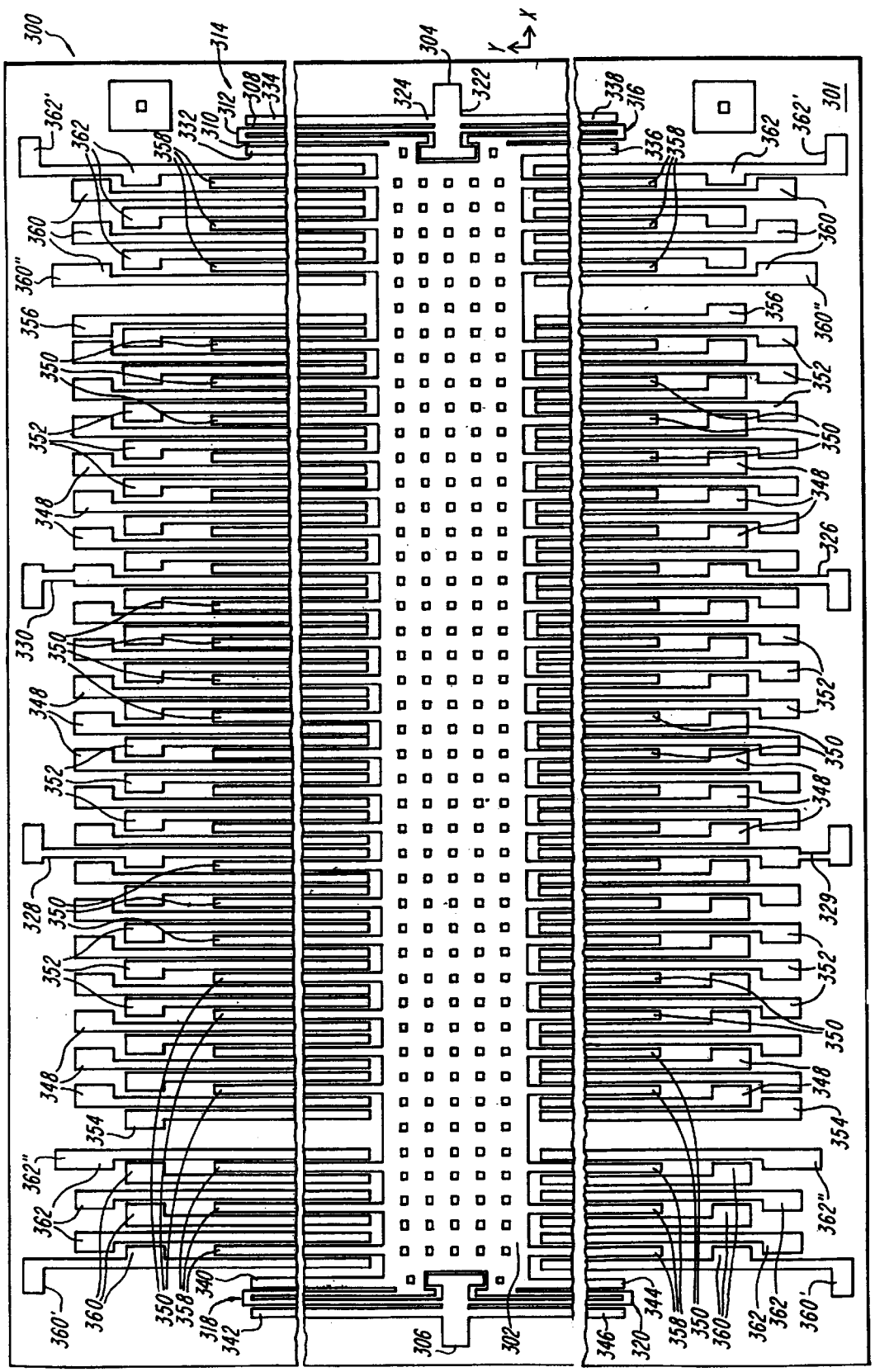
FIG. 2 is a layout diagram of an acceleration sensor constructed according to the principles of the invention.

FIG. 2 illustrates a micromachined sensor 300 (drawn to scale) which is constructed according to the principles of the invention. A central member 302 is a polysilicon structure suspended above a bootstrap diffusion layer (not shown) disposed within an underlying substrate 301. Member 302 is approximately 467 micrometers long and 57 micrometers wide. (The dimensions provided herein are is merely exemplary and in no way limiting.) The bootstrap diffusion layer is formed from an n+ doped emitter diffusion region in the substrate. Member 302 is approximately parallel to the surface of substrate 301.

Member 302 is connected to anchors 304 and 306 through folded springs 314, 316 and 318, 320, respectively. Springs 314–320 are formed from polysilicon. Anchors 304, 306 are "T" shaped with a vertical portion 322 having an approximate length and width of 28.7 and 9.7 micrometers, respectively, and a horizontal crossing portion 324 having an approximate length and width of 21.7 and 4.7 micrometers, respectively. Anchors 304 and 306 are mounted on the substrate outside the bootstrap diffusion layer through small rectangular regions at the bottom of the "T". (The rest of the T is suspended above substrate 301.)

Springs 314–320 consist of legs 308, 310 and 312, all of which are approximately 2.2 micrometers wide. Long legs 308 and 310 are parallel to each other, connected at one (i.e., "external") end by short leg 312. The other (i.e., "internal") ends of long legs 308 and 310 are connected to an anchor (e.g., 304 or 306) and member 302, respectively. Long legs 308 and 310 are flexible, allowing member 302 to move along the X-axis (passing through anchors 304 and 306) in response to a force along the X-axis, as the internal ends of long segments 308 and 310 move closer together or further apart. Long segments 308 and 310 are approximately 116.7 and 98.2 micrometers long, respectively, and are separated by a gap of approximately 1.3 micrometers. Alternatively, other shapes can be used for the springs. Springs 314–320 form four operating structures, each performing a mechanical function.

Disposed to the left and right of each spring 314–320 is a first dimensional-control structure (i.e., a dimensional-control finger) as shown in FIG. 2. Specifically, internal dimensional-control fingers 332, 336 (coupled to member 302) are disposed to the left of springs 314 and 316, respectively. Further, a set of second dimensional-control fingers 334, 338 (coupled to anchor 304) are disposed to the right of springs 314 and 316, respectively. This same relationship exists for springs 318 and 320, where external dimensional-control fingers disposed to the left (i.e., 342 and 346, respectively) are coupled to anchor 306 while internal dimensional-control fingers disposed to the right (i.e., 340 and 344, respectively) are coupled to member 302.

The distance between each dimensional-control finger and associated spring is approximately 1.3 micrometers and the width of each dimensional-control finger is approximately 3.7 micrometers. The length of fingers 332, 336, 340 and 344 is approximately 94.5 micrometers, and the length of fingers 334, 338, 342 and 346 is approximately 118 micrometers.

Extending from the sides of member 302 along the Y-axis are parallel polysilicon sense fingers 350. In sensor 300, sense fingers 350 are substantially similar (i.e., substantially the same shape and dimension); each being approximately 3.4 micrometers wide and approximately 109 micrometers long. As shown in FIG. 2, there are 21 sense fingers on each side of member 302. Sense fingers 350 each constitute an operating structure that performs an electrical function. With a total of 42 fingers, there are many of these electrical operating structures.

To the left and right (along the X-axis) of each sense finger 350, and not connected to member 302, is a left fixed finger 348 and a right fixed finger 352, respectively. These fixed fingers are formed from polysilicon and anchored to substrate 301. Preferably, the inner set of fixed fingers and outer set of fixed fingers on each side of member 302 are approximately 124 and 144 micrometers long, respectively. Each finger 348,352 is approximately 3.4 micrometers wide and each is separated from an adjoining sense finger 350 by a gap of approximately 1.3 micrometers. Adjoining left and right fixed fingers 348 and 352 are also spaced approximately 1.3 micrometers apart, although this dimension is not as critical as the dimensions on either side of finger 350. Rather than being limited by dimensional control, the distance between fingers 348 and 352 is controlled by an electrical parameter; i.e., this distance must not be so large as to affect the electrical field lines on the inside of gaps between fingers 350–348 and 350–352.

All of the left fixed fingers 348 on each side of member 302 are connected together through a heavily n+ doped polysilicon region, as are all of the right fixed fingers 352 (regions not shown). Electrical connection to the inner set of fixed fingers on each side of member 302 is made with polysilicon microbridges 326 and 328. Similarly, electrical connection to the outer set of fixed fingers on each side of member 302 is made with polysilicon microbridges 329 and 330.

Figure 3:
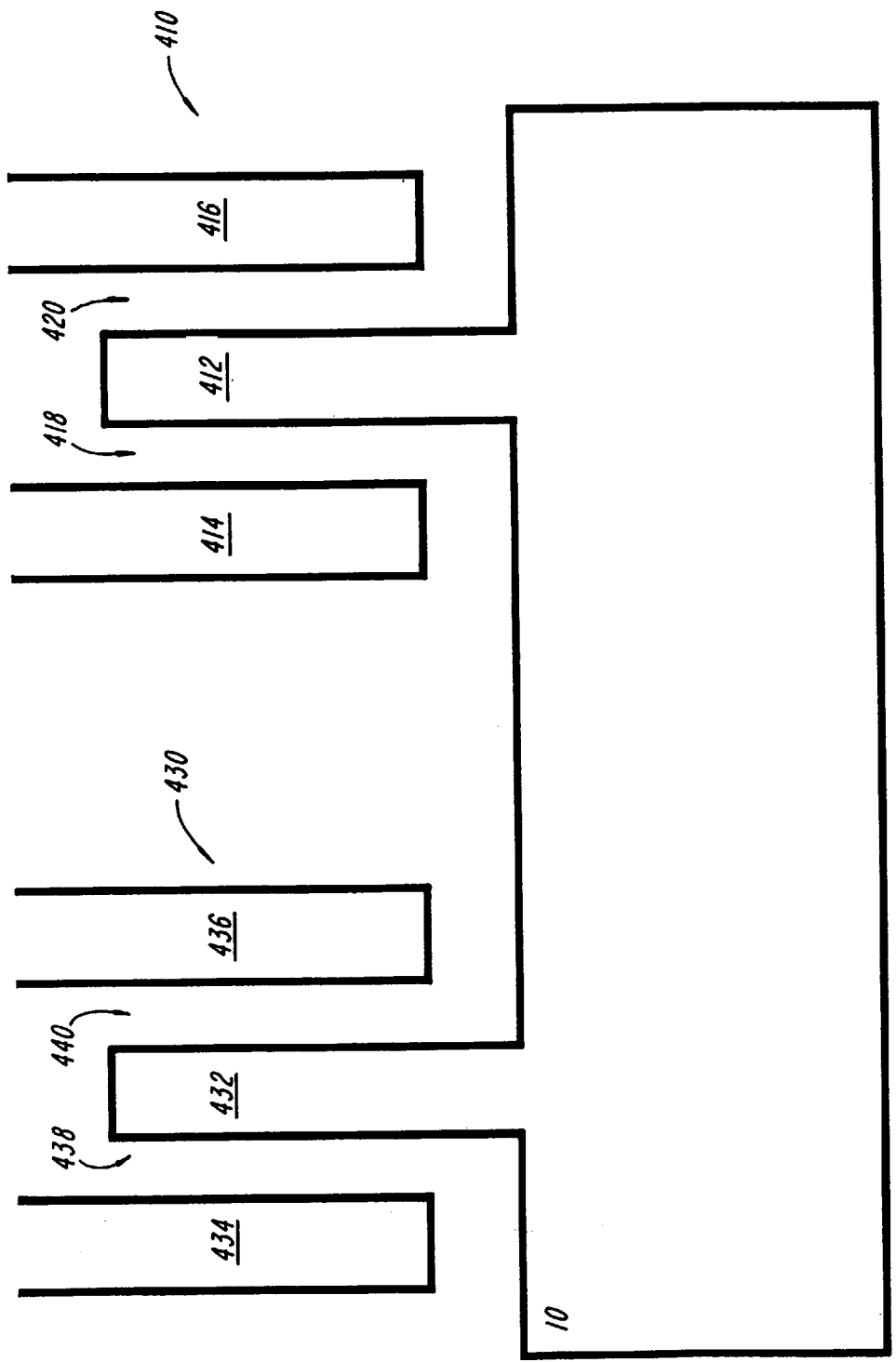
FIG. 3 is a schematic diagram of differential capacitors formed by the acceleration sensor of FIG. 2.

Referring to FIGS. 2 and 3, sense fingers 350 (which form a single electric node with central member 302) collectively form center electrode 412 of differential sense capacitor 410. Left fixed fingers 348 form left electrode 414 and right fixed fingers 352 form right electrode 416 of differential capacitor 410, which consists of left capacitor 418 and right capacitor 420. Preferably, left capacitor 418 and right capacitor 420 have the same capacitance. Each set of one sense finger 350 and its adjoining left fixed finger 348 and right fixed finger 352 forms one "cell" of differential capacitor 410, with all of the cells substantially similar and connected in parallel.

When member 302 moves to the right relative to fixed fingers 348 and 352 (in response to force applied along the X-axis), the distance between each sense finger 350 and the right fixed finger 352 of the same cell decreases, which increases the capacitance of right capacitor 420. At the same time, the distance between each sense finger 350 and the left fixed finger 348 of the same cell increases, decreasing the capacitance of left capacitor 418.

Member 302 is connected to resolving circuitry through a heavily n+ doped region of polysilicon, which extends from anchor 304. An example of resolving circuitry is and a discussion of acceleration sensor operation is provided in U.S. Pat. No. 5,345,824.

To the left of the leftmost left fixed finger 348 on each side of member 302 is a right dummy finger 354. Similarly, to the right of the rightmost right fixed finger 352 on each side of member 302 is a left dummy finger 356. These dummy fingers are connected to their corresponding fixed fingers (i.e., right dummy fingers 354 are connected to right fixed fingers 352 and left dummy fingers 356 are connected to left fixed fingers 348). This ensures that end cells of differential capacitor 410 behave the same as the middle cells. More specifically, dummy fingers 354 and 356 are installed to ensure that the electrical field present at the leftmost left fixed fingers 348 and rightmost right fixed fingers 352, respectively, are the same as the electric fields found at the "middle" left and right fixed fingers 348, 352 (e.g., between microbridges 326 or 328 and 330).

The distances between (1) right dummy fingers 354 and leftmost left fixed finger 348, and (2) left dummy fingers 356 and rightmost right fixed finger 352 are subject to the same limitation. Specifically, these distances must not be so large so to affect the electrical field lines on the inside of gaps between fingers 350–348 and 350–352.

At both ends of member 302 are 6 polysilicon selftest fingers 358 (i.e., a total of 12). These fingers are approximately 3.7 micrometers wide and 109 micrometers long. Self-test fingers 358 are part of the same electric node as sense fingers 350 and the body of member 302. To the sides of each self-test finger 358, and not connected to member 302, are a left and a right polysilicon actuator finger 360 and 362, respectively. When no force is applied to member 302, self-test fingers 358 are midway between actuator fingers 360 and 362, resulting in a distance between fingers 358 and adjoining actuator fingers 360, 362 of approximately 1.3 micrometers.

The inner set of actuator fingers 360, 362 are approximately 124 micrometers long. Additionally, the outer set of actuator fingers 360, 362 are approximately 144 micrometers long. Both fingers are approximately 3.7 micrometers wide and anchored to substrate 301. Actuator fingers 360 are coupled to each other via heavily doped n+ polysilicon regions (not shown) and electrically coupled via polysilicon microbridges 360' and 360". Similarly, actuator fingers 362 are coupled to each other via heavily doped n+ polysilicon regions (not shown) and electrically coupled via polysilicon microbridges 362' and 362".

Referring to FIG. 3, self-test fingers 358 form center electrode 432 of differential self-test capacitor 430. Left actuator fingers 360 and right actuator fingers 362 form left electrode 434 and right electrode 436, respectively, of differential capacitor 430.

Like differential capacitor 410, the separation between each self-test finger 358 and its adjoining actuator fingers 360, 362 changes when sensor 300 is subject to a force along the X-axis. However, while differential sense capacitor 410 is used to measure the magnitude of the force applied to the sensor, differential self-test capacitor 430 is used to generate electrostatic forces. More specifically, actuator fingers 360, 362 are used to apply an electrostatic force to self-test finger 358 to deflect central members 302 for testing purposes.

Capacitor fingers 348–362 and springs 314–320 are "operating" structures; i.e., they provide an operating function (e.g., electrical or mechanical) and may also provide dimensional control through consistent spacing. In contrast, fingers 332–346 are dimensional control structures; i.e., their sole purpose is to provide dimensional control through the creation of consistent spacing at select locations within the device (e.g., next to electrical operating structures, mechanical operating structures, etc.). Sensor 300 is constructed so that certain critical spacing dimensions are uniformly maintained at a predefined distance; i.e., spacing between sense capacitor fingers (i.e., between fingers 350–348 and 350–352) and spacing between and bordering spring legs 308 and 310. This is achieved by ensuring existing operating structures (e.g., fingers 348–352 and spring legs 308,310) are configured to maintain uniform distances between each other (such as by reducing the distance between legs 308 and 310 to approximately the same distance as between fingers 350–348 and 350–352) and by adding certain dimensional-control structures (e.g., fingers 332–346), which establish these same uniform distances at select locations within the sensor.

The dimensional-control structures in sensor 300 create a new spacing environment (i.e., spacing bordering legs 308, 310) with new structures (i.e., internal and external fingers 332–346) that differ from existing structures. These new structures establish a dimensional relationship (i.e., uniform spacing) between functionally and physically different micromachined structures (i.e., fingers and springs). As noted above, the uniform spacing between sense capacitor fingers 348–352 and folded spring legs 308,310 is approximately 1.3 micrometers. This dimension, which represents a predefined distance selected by a designer, is created from a mask spacing of about 1.0 micrometers.

Referring to FIG. 2, every sense finger 350 is longitudinally bordered by left fixed finger 348 and right fixed finger 352. Accordingly, each capacitor sense finger 350 used to create differential capacitor 410 (FIG. 3) is longitudinally bordered by a uniform space or gap (i.e., "$d_0$") of approximately 1.3 micrometers. Additionally, all spring legs 308 and 310 are disposed next to each other maintaining the same uniform distance of approximately 1.3 micrometers. These legs are longitudinally bordered by an internal dimensional-control finger (i.e., 332, 336, 340 or 344) and external dimensional-control finger (i.e., 334, 338, 342 or 346). Accordingly, each spring leg 308 or 310 is longitudinally bordered by a uniform space or gap of approximately 1.3 micrometers.

Figure 4:
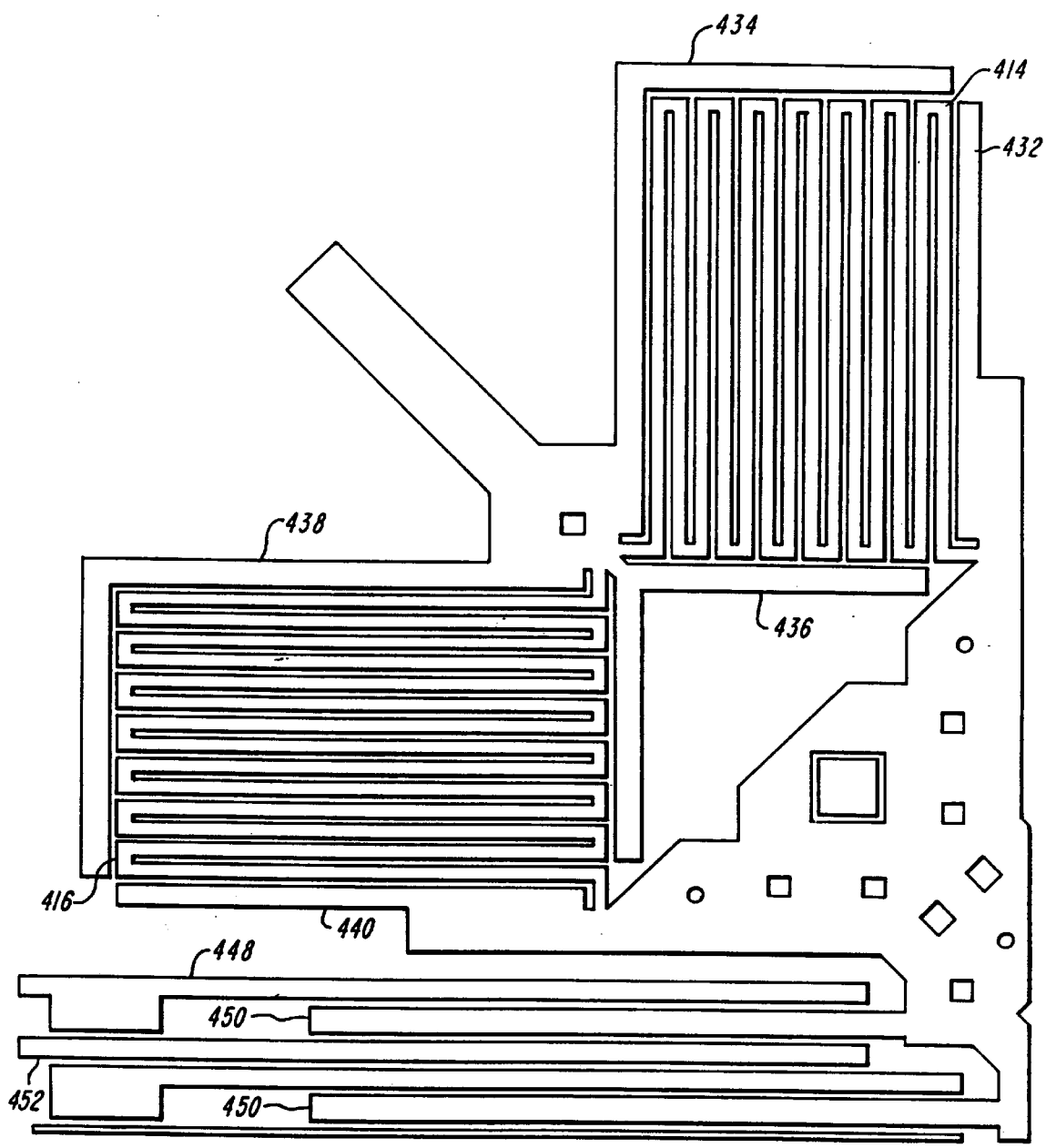
FIG. 4 is a layout of an alternative embodiment of a micromachined structure constructed according to the principles of the invention.

Springs 314–320 represent only one example of an applicable spring configuration. These structures may also be configured in more complex shapes, such as in a series of folds like springs 414, 416 of FIG. 4. Referring to this figure, complex springs 414, 416 are surrounded by dimensional-control structures 432–440 to achieve approximately the same uniform spacing experienced between capacitor fingers 450–448 and 450–452. Further, the spacing between the series of folds in each spring 414 and 416 also provide approximately the same uniform spacing as between capacitor fingers 448–452. Alternatively, these springs need not be folded at all (see, U.S. Pat. No. 5,345,824).

The spacing uniformity maintained in sensor 300 represents a beneficial dimensional relationship between structures disposed within this device. This relationship facilitates correlation of dimensional variation between functionally and/or physically different micromachined structures. Physically different structures are those having different dimensions and/or shape (e.g., fingers 350 and springs 314–320). Similarly, this relationship facilitates correlation of dimensional variation between functionally and/or physically similar micromachined structures. Physically similar structures are those having substantially similar dimensions and shape (e.g., a plurality of fingers 350). By maintaining uniform spacing between and among sense capacitor fingers and, for example, folded spring legs, manufacturing processes applied to both structures (e.g., etching or photolithography) and variations in such processes (e.g., overetching) affect the physical dimensions of these structures (e.g., spring width and finger width) in a highly correlated manner.

In the embodiment of FIG. 2, correlation between spring width variation and finger width variation (during manufacturing) improved by a factor of four over previously-known sensor configurations that did not include any dimensional relationship between capacitor fingers and springs (see, FIG. 1). As such, the correlation of dimensional variation in springs 314–320 (created by manufacturing variations) with the dimensional variation in fingers 350 improved from 32% of the allowed tolerance to 8% of such tolerance. The process used to manufacture sensor 300 is described in commonly-owned U.S. Pat. Nos. 5,314,572, 5,326,726 and 5,364,497, each of which is hereby expressly incorporated by reference in its entirety for all purposes.

In summary, by maintaining spacing uniformity among structures within certain components (i.e., sense capacitors and springs) of a micromachined device, the physical dimensions of these structures formed by the same manufacturing processes tend to track each other. For example, in sensor 300 of FIG. 2, if sense fingers 350 are thicker than normal by a specific amount due to manufacturing variations (and thus the space between them is thinner than normal), then springs 314–320 are also thicker than normal by approximately the same amount. Conversely, when such fingers are thinner than normal by a specific amount, the supporting springs are also thinner than normal by approximately the same amount.

Knowing the relationship between spring dimensions and capacitor finger spacing, it is possible to analyze and predict the performance of sensor 300 more accurately than if the dimensions were uncorrelated. For example, this relationship may be utilized to determine device sensitivity of an acceleration sensor. Alternatively, the relationship can be used to reveal how much electrostatic force is generated by a given voltage on actuator fingers 360, 362 (which is determined from capacitor finger spacing). In short, select performance characteristics for any micromachined device can be forced to correlate based on dimensional relationships between select structures.

Through the use of the layout techniques described above (i.e., consistent spacing between two or more existing, operating structures and/or consistent spacing between an existing operating structure and a new dimensional-control structure), dimensional relationships are established between structures that can be exploited to infer physical characteristics of select structures through a single, empirical measurement. For example, by measuring the peak output (i.e., resonant) frequency of an acceleration sensor such as sensor 300, it is possible to infer tether dimensions, capacitor plate spacing and beam mass. These values may then be used to determine the sensitivity of the device through conventional electromechanical analysis.

More specifically, the resonant frequency of sensor 300, defined by equation (1), is a function of at least three variables: spring constant "k" (defined by the geometry and composition of the spring) beam mass m (where "m" includes the mass of central member 302 and contiguous structures) and capacitor plate spacing. The procedure used to measure this frequency is well known to those having ordinary skill in the art. After measuring the resonant frequency "$f_0$" of sensor 300, equation (1) may be solved for an approximate value of k/m. If the layout dimensions of the acceleration sensor springs correlate with the layout dimensions of the capacitor fingers (and therefore the features which determine variations in m), then conventional electromechanical analysis will yield the values of spring width (W) and capacitor finger gap ($d_0$) based on the value of k/m.

$$f_0 = (k/m)^{1/2}/2\pi \tag{1}$$

Since the spacing dimensions longitudinally bordering legs 308 and 310 are essentially the same as the spacing dimensions longitudinally bordering fingers 348–352, changes in the former resulting from manufacturing variations may be inferred to the latter. The foregoing analysis takes advantage of this relationship to use the ratio k/m to more accurately determine the values $d_0$ and W. These values may be used in conventional electromechanical analysis to determine, among other things, the sensitivity of sensor 300. In summary, as a result of the structural relationships in sensor 300, a single indirect measurement (i.e., resonant frequency) can provide information about individual component dimensions which are necessary to determine sensitivity and thereby accurately calibrate sensor 300.

In addition to the foregoing, the consistent spacing established in sensor 300 affects wall or thickness geometry. For example, it is desirable for springs 314–320 to have vertical walls in a cross-section view. If there is a slope or curvature to the walls of the spring, then the spring constant of the device is affected greatly. Provided the manufacturing process of sensor 300 can be controlled to ensure that sense fingers 350 have vertical walls, then springs 314–320 will also have vertical walls since the environment about the springs is the same as that about the sense fingers (i.e., through the use of fingers 332–346 and a reduction of distance between legs 308 and 310 to a predefined amount).

It is to be understood that the above description is intended to be illustrative and not restrictive. Many variations to the above-described micromachined device will be apparent to those of skill in the art. For example, while the description has been made primarily with reference to accelerometer design, it will be apparent that the device would have application in the design of any technology that is micromachined, such as micromachined gyroscopes, pumps, motors and resonant structures. Any structure of a micromachined device may be correlated in accordance with the principles of the invention. The scope of the invention, therefore, should be determined not with reference to the above description but, instead, with reference to the appended claims, along with their full scope of equivalence.

What is claimed is:

1. A micromachined device comprising:
    a first dimensional-control structure;
    a first operating structure having a first side and a second side, said first side disposed proximate to said first dimensional-control structure at a predefined distance; and
    a second dimensional-control structure disposed proximate to said second side at approximately said predefined distance;
    wherein the dimensional-control structures are structures whose sole purpose is to provide dimensional control, and wherein the first operation structure performs at least one of a mechanical and electrical function.

2. The micromachined device of claim 1 wherein said first operating structure is a spring.

3. The micromachined device of claim 2 wherein said spring comprises:
    a first spring leg having said first side; and
    a second spring leg having said second side, wherein said second spring leg is disposed proximate to said first spring leg at approximately said predefined distance.

4. The micromachined device of claim 2 further comprising:
    a second operating structure coupled to said first operating structure, said second operating structure having a third side and a fourth side;
    a third operating structure disposed proximate to said third side at approximately said predefined distance; and a fourth operating structure disposed proximate to said fourth side at approximately said predefined distance.

5. The micromachined device of claim 4 wherein said second operating structure is a sense finger.

6. The micromachined device of claim 5 wherein said third and fourth operating structures are fixed fingers, the sense finger and fixed fingers forming a capacitor.

7. A micromachined device comprising:

a first operating structure performing a first function;

a dimensional-control structure disposed proximate to said first operating structure at a predefined distance;

a second operating structure coupled to said first operating structure, said second operating structure performing a second function; and a third operating structure disposed proximate to said second operating structure at approximately said predefined distance, said third operating structure performing said second function;

wherein the dimensional-control structures are structures whose sole purpose is to provide dimensional control, and wherein the first operation structure performs at least one of a mechanical and electrical function.

8. The micromachined device of claim 7 wherein said first function is mechanical.

9. The micromachined device of claim 8 wherein said second function is electrical.

10. The micromachined device of claim 9 wherein said first operating structure is a spring and said second operating structure is a sense finger in a sense capacitor.

11. A micromachined device comprising:

a substrate;

a central member suspended over the substrate;

a spring structure coupled to said central member, the spring structure having a first side and a second side;

a first dimensional-control structure disposed proximate to said first side at a predefined distance;

a second dimensional-control structure disposed proximate to said second side at approximately said predefined distance, wherein the first and second dimensional-control structures are structures whose sole purpose is to provide dimensional control; and a first sense capacitor including a first sense finger coupled to said central member and a first fixed finger disposed proximate to said first sense finger at approximately said predefined distance.

12. The micromachined device of claim 11 wherein said spring structure is a folded spring comprising a first long leg, a second long leg disposed parallel to said first long leg, and a short leg intercoupling said first and second long legs, said first side being on said first long leg, and said second side being on said second long leg.

13. The micromachined device of claim 12 wherein said first long leg is spaced from said second long leg a distance equal to approximately said predefined distance.

14. The micromachined device of claim 13 further comprising a second sense capacitor coupled to said member, said second capacitor including said first sense finger and a second fixed finger disposed proximate to said first sense finger at approximately said predefined distance, wherein said first sense finger is disposed between said first and second fixed fingers.

15. A micromachined device comprising:

a first operating structure performing a first function that is at least one of an electrical and mechanical function, said first operating structure having a first side and a second side and being laid out so that spacing disposed immediately proximate to said first and second sides is set at a predefined distance; and a second operating structure coupled to said first operating structure and performing a second function that is at least one of an electrical and mechanical function different from the first function, said second operating structure having a first external side that faces outwardly from said second operating structure, the second operating structure being laid out so that spacing disposed immediately proximate to said first external side is set at said predefined distance, whereby a dimensional relationship is established between said first and said second structures, said relationship providing control of dimensional variation between said first and second structures.

16. The micromachined device of claim 15 wherein said spacing disposed immediately proximate to said first side of said first operating structure is between said first operating structure and a third operating structure that performs at least one of a mechanical and an electrical function.

17. The micromachined device of claim 16 wherein said spacing disposed immediately proximate to said first external side is between said second operating structure and a first dimensional-control structure, wherein the dimensional control structure has a sole purpose of providing dimensional control.

18. The micromachined device of claim 17 wherein said spacing disposed immediately proximate to said second side is between said first operating structure and a fourth operating structure that performs at least one of a mechanical and an electrical function.

19. The micromachined device of claim 18 wherein said second operating structure has a second external side that faces away from said second operating structure and is laid out so spacing disposed immediately proximate to said second external side is set at said predefined distance between said second operating structure and a second dimensional-control structure, wherein the dimensional control structure has a sole purpose of providing dimensional control.

20. The micromachined device of claim 19 wherein said first operating structure is a sense finger in a sense capacitor, said second operating structure is a spring and said third and fourth operating structures are fixed fingers.

21. A micromachined device comprising:

a substrate;

a movable mass suspended in a plane over and parallel to the substrate and movable along a first axis in the plane, the movable mass including a plurality of movable fingers extending along parallel axes in the plane and orthogonal to the first axis;

a plurality of fixed fingers that are stationary with respect to the substrate and interleaving with the movable fingers to form a differential capacitor, the fixed fingers being spaced a distance d from the fingers on the mass;

spring members anchored to the substrate and extending to the movable mass to allow the mass to move relative to the substrate; and dimensional control members formed next to the spring members and spaced from the spring members by the distance d, the dimensional control members performing substantially only a dimensional control function.

22. A micromachined device comprising:

a substrate;

a movable mass suspended in a plane over and parallel to the substrate and movable along a first axis in the plane, the movable mass including a plurality of movable fingers extending along parallel axes in the plane and orthogonal to the first axis, the plurality of movable fingers being arranged in a row from a first finger to an n-th finger;

a plurality of fixed fingers that are stationary with respect to the substrate and interleaving with and parallel to the movable fingers to form a differential capacitor, the fixed fingers including a first group of n fingers electrically coupled together, with each spaced a distance d from a corresponding one of the movable fingers and each on one side of the corresponding movable finger, and a second group of n fingers electrically coupled together, with each spaced a distance d from a corresponding movable finger and each on the other side of the corresponding movable finger, such that a plurality of differential capacitive cells is formed, with each cell having a movable finger between a fixed finger in the first group and a fixed finger in the second group and spaced a distance d from the fixed finger in the first group and from the fixed finger in the second group, the cells being ordered from a first cell to an n-th cell corresponding to the number of the movable finger in the cell;

a first dimensional control finger electrically coupled to the second group of fixed fingers and positioned a distance d from the fixed finger in the first group in the first cell, such that the fixed finger in the first group in the first cell is between the first movable finger and the first dimensional control finger; and a second dimensional control finger electrically coupled to the first group of fixed fingers and positioned a distance d from the fixed finger in the second group in the n-th cell, such that the fixed finger in the second group in the n-th cell is between the n-th movable finger and the second dimensional control finger.

* * * * *